United States Patent
Lim (10) Patent No.: US 6,737,291 B1
(45) Date of Patent: May 18, 2004

(54) METHOD FOR FABRICATING IMAGE SENSOR USING SALICIDE PROCESS

(75) Inventor: Boo-Taek Lim, Ichon-shi (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 10/318,072

(22) Filed: Dec. 13, 2002

(30) Foreign Application Priority Data

Oct. 23, 2002 (KR) .................. 10-2002-0064833

(51) Int. Cl.[7] ...................... H01L 21/00; H01L 21/8238
(52) U.S. Cl. ............... 438/45; 438/200; 438/211; 438/981
(58) Field of Search ............ 438/45, 200, 211, 438/275, 210, 279, 229, 258, 981

(56) References Cited

U.S. PATENT DOCUMENTS 6,194,258 B1 * 2/2001 Wuu .................. 438/200
6,448,101 B1 * 9/2002 Kuo et al. .............. 438/45

OTHER PUBLICATIONS

Yaung et al., IEEE Electron Device Letters, vol. 22, No. 2, Feb. 2001, pp. 71–73.

Wuu et al., Taiwan Semiconductor Manufacturing Company, Hsin–Chu, Taiwan, R.O.C., Department of Electrical Engineering, National Cheng Kung University, Tainan, Taiwan, R.O.C., EECS Department, Massachusetts Institute of Technology, MA, U.S.A., 4 pages.

* cited by examiner

Primary Examiner—John F. Niebling
Assistant Examiner—Walter L. Lindsay, Jr.
(74) Attorney, Agent, or Firm—Birch, Stewart, Kolasch & Birch, LLP (57) ABSTRACT

A method for fabricating an image sensor capable of preventing a salicide layer formation on a photodiode as simultaneously as of forming the salicide layer selectively on a gate electrode closely located to a transistor which includes the steps of: forming a gate electrode on a substrate; forming an insulating spacer at lateral sides of the gate electrode; forming a photodiode in the substrate exposed at an one edge of the gate electrode; forming a floating diffusion area in the substrate exposed at the other edge of the gate electrode; forming a salicide barrier layer on the photodiode, wherein the salicide barrier layer exposes a upper surface and corners of the gate electrode; and forming a salicide layer on the exposed upper surface and the upper corners of the gate.

8 Claims, 7 Drawing Sheets

METHOD FOR FABRICATING IMAGE SENSOR USING SALICIDE PROCESS

FIELD OF THE INVENTION

The present invention relates to a semiconductor device fabrication technology; and, more particularly, to a method for fabricating an image sensor.

DESCRIPTION OF RELATED ARTS

With respect to a semiconductor device fabrication technology requiring high integration and high-speed processes, it has been today actively researched on a method for achieving low resistance for a wiring material to decrease parasitic resistance.

For instance, in case of a multi-layer wiring, the grain size of Al constructing a metal line tends to be largely scaled and highly aligned to attain high reliability of the Al. Concurrently, it is also attempted to replace a commonly used material for the metal line with copper (Cu) to attain high reliability and to realize demands of low resistance. Also, in case of a conductive layer wiring process such as a gate electrode and a bit line, it is attempted to utilize silicide using titanium (Ti), cobalt (Co) and nickel (Ni) instead of using molybdenum (Mo), tungsten (W) to acquire a low temperature process required to a formation of devices highly integrated.

Also, image sensor is a device that receives and converts light from an external source to an electrical output. A photodiode is an area to which rays of light enter. A pnp junction or a pn junction in the photodiode forms an electron depletion area, which receives the light from the external source and further forms an electron hole pair (hereinafter referred as to EHP).

A unit pixel of a complementary metal-oxide semiconductor (CMOS) image sensor includes a single photodiode (hereinafter referred as to PD), a transfer transistor $T_x$, a reset transistor $R_x$, a drive transistor $D_x$, and a select transistor $S_x$. The transfer transistor $T_x$ is closely located to the PD.

In a process for fabricating an image sensor with above 0.25 μm technology, a salicide process is employed to reduce resistance of an active area and a polysilicon gate. However, metal layers implemented to the salicide process have a very high reflection ratio to light, and thus, it is impossible to apply the metal layers to a PD.

Figure 1:
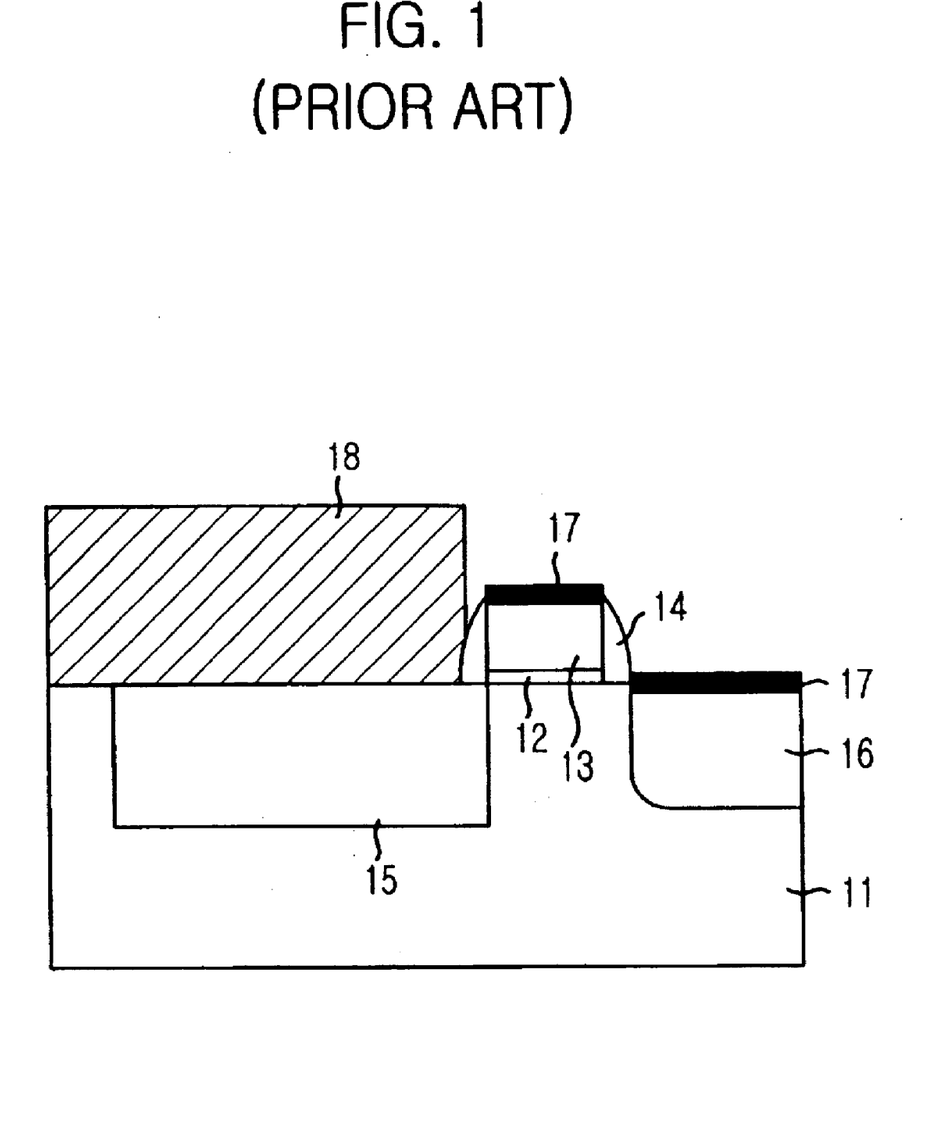
FIG. 1 is a diagram schematically illustrating a complementary metal-oxide semiconductor (CMOS) image sensor in accordance with a prior art.

FIG. 1 is a diagram schematically illustrating a CMOS image sensor fabricated in accordance with a prior art.

Referring to FIG. 1, a gate oxide layer 12 and a gate electrode 13 are stacked on a selective area of a p-type epi layer 11. At one side of the gate electrode 13, a PD 15 is formed within an exposed area of the p-type epi layer 11, and a floating diffusion area 16 is formed within another exposed area of the p-type epi layer 11 at the other side of the gate electrode 13.

Herein, the gate electrode 13 is a polysilicon layer and a gate electrode of a transfer transistor.

Also, a salicide layer 17 is formed on each upper surface of the gate electrode 13 and the floating diffusion area 16.

In the above prior art, a salicide mask 18 is formed on the PD 15 to prevent the salicide layer from being formed on the PD 15.

At this time, a stepper used in the salicide mask 18 is an i-line equipment. However, with respect to overlay and critical dimension accuracies, it is difficult to accurately distinguish polysilicon closely located to the PD and subsequently put a mask on the polysilicon.

For example, in case that the PD is exposed due to misalignment of the salicide mask 18, a salicide layer is formed on the PD, and thus, a surface of the PD becomes unstabilized, further resulting in occurrence of dark signal. At this time, the dark signal occurs due to dark currents flowing from the PD to the floating diffusion area as electrons, generated even without inputs of incident lights due to the unstabilized surface, are stored into the PD.

Also, if the salicide mask 18 partially covers a portion of the gate electrode, the salicide layer is then prevented from being formed on the transfer transistor in a subsequent salicide process. Therefore, it is impossible to obtain desired properties of the transistor, and this fact becomes a factor that changes characteristics of a pixel of the image sensor.

SUMMARY OF THE INVENTION

It is, therefore, an object of the present invention to provide a method for fabricating an image sensor capable of preventing a salicide layer from being formed on a photodiode as simultaneously as of forming the salicide layer selectively on a gate electrode of a transistor closely located to the photodiode.

In accordance with an aspect of the present invention, there is provided a method for fabricating an image sensor, including the steps of: forming a gate electrode on a substrate; forming an insulating spacer at lateral sides of the gate electrode; forming a photodiode in the substrate exposed at an one edge of the gate electrode; forming a floating diffusion area in the substrate exposed at the other edge of the gate electrode; forming a salicide barrier layer on the photodiode, wherein the salicide barrier layer exposes a upper surface and corners of the gate electrode; and forming a salicide layer on the exposed upper surface and the upper corners of the gate.

In accordance with another aspect of the present invention, there is also provided a method for forming an image sensor, including the steps of: forming a gate electrode on a substrate; forming an insulating spacer at lateral sides of the gate electrode; forming a photodiode in the substrate exposed at one edge of the gate electrode; forming a floating diffusion area in the substrate exposed at the other edge of the gate electrode; forming a salicide barrier layer on the photodiode and the floating diffusion area, wherein the salicide barrier layer exposes an upper surface and upper corners of the gate electrode; removing the salicide barrier layer on the floating diffusion area; and forming a plurality of salicide layers simultaneously formed on the upper surface and upper corners of the gate electrode and the upper surface of the floating diffusion area.

BRIEF DESCRIPTION OF THE DRAWING(S)

The above and other objects and features of the present invention will become apparent from the following description of the preferred embodiments given in conjunction with the accompanying drawings, in which.

DETAILED DESCRIPTION OF THE INVENTION

FIGS. 2A to 2E are cross-sectional views illustrating a method for fabricating an image sensor in accordance with a first preferred embodiment of the present invention.

Figure 2A:
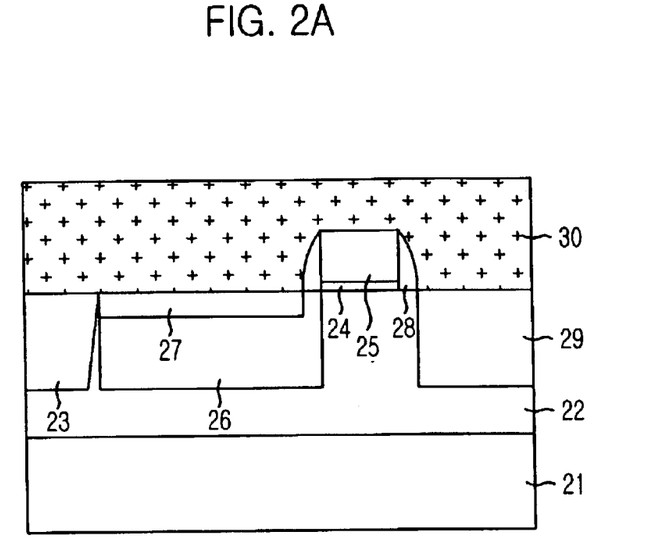
FIGS. 2A to 2E are cross-sectional views illustrating a method for fabricating an image sensor in accordance with a first preferred embodiment of the present invention.

Referring to FIG. 2A, a p-type epi-layer 22 doped with a low concentration of p-type impurities is grown on a p-type substrate 21 doped with a high concentration of p-type impurities. Herein, the reason for growing the p-type epi layer 22 is because a depth of a depletion layer of a photodiode can be increased due to the existence of the p-type epi layer 22, and thus, it is possible to obtain an excellent photosensitivity. Another reason for growing the p-type epi layer 22 is because the existing p-type substrate 21 doped with a high concentration of the p-type impurities recombines optical charges, which can be generated at a deeper side of the p-type substrate 21 where the depletion layer of the photodiode cannot be reached, so as to prevent the crosstalk phenomenon which occurs between unit pixels due to irregular movements of the optical charges.

Next, a field insulating layer 23 for isolating the unit pixels is formed on a predetermined portion of the p-type epi layer 22 through the use of a local oxidation of silicon (LOCOS) technique.

On the p-type epi layer 22, a gate oxide layer 24 and a gate electrode 25 are stacked. At this time, the gate electrode 25 is a polysilicon layer and a gate electrode of a transfer transistor closely located to a photodiode (hereinafter referred as to PD).

An $n^-$ area 26 is formed within the p-type epi-layer 22 at one side of the gate electrode 25 through an ion implantation technique using the gate electrode 25 and an additional photosensitive pattern (not shown) as a mask. Then, a shallow $p^0$ area 27 is formed within the $n^-$ area 26 of the p-type epi-layer 22 through a blanket ion implantation technique.

Thereafter, an insulating spacer 28 on both lateral sides of the gate electrode 25 is formed. At this time, the insulating spacer 28 is formed through an etch-back process proceeded after depositing an oxide or nitride layer on the p-type epi layer 22 including the gate electrode 25.

Subsequently, a floating diffusion area 29 aligned to an edge of the insulating spacer 28 of the gate electrode 25 in an opposite direction to the $n^-$ area 26 is formed by employing the ion implantation technique using the gate electrode 25 and the insulating spacer 28 as an ion implantation mask.

Formations of the PD, the gate electrode of the transfer transistor and the floating diffusion area are completed in accordance with the above-described processes.

Next, an oxide layer 30 is deposited on the p-type epi layer 22 of the gate electrode 25. At this time, the oxide layer 30 is formed in such a manner to cover the gate electrode 25 completely.

Figure 2B:
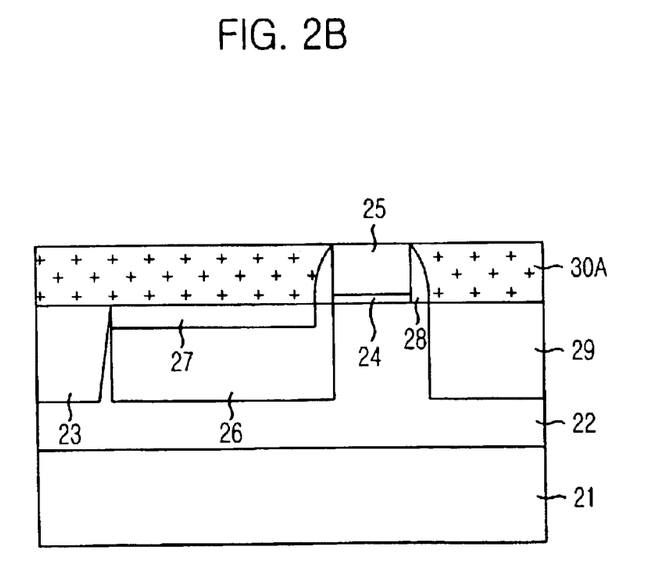

With reference to FIG. 2B, the oxide layer 30 is proceeded with a chemical and mechanical polishing (CMP) process until exposing an upper surface of the gate electrode 25. At this time, after the CMP process, a polished oxide layer 30A remains on top of the photodiode and the floating diffusion area 29.

Figure 2C:
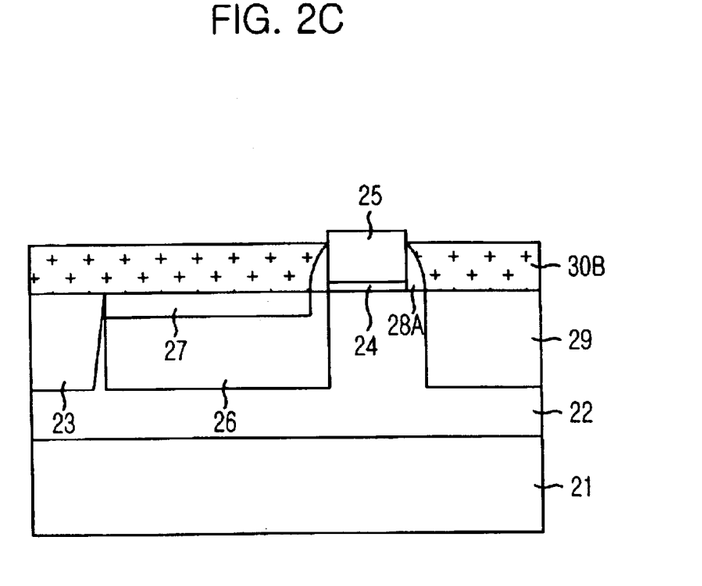

Referring to FIG. 2C, a salicide barrier layer 30B that exposes an upper surface and upper corners of the gate electrode 25 is formed by performing an over CMP process to obtain a subsequent salicide process margin. At this time, the salicide barrier layer 30B is formed by applying the over CMP process to the polished oxide layer 30A, and still covers upper portions of the PD and the floating diffusion area 29.

Due to the over CMP process, the insulating spacer 28 at both sides of the gate electrode 25 is also partially polished. Hence, an insulating spacer pattern 28A remains with a lowered height.

As seen from the above, the over CMP process is performed to obtain a process margin of the CMP process and a higher process margin when forming a subsequent salicide layer.

Figure 2D:
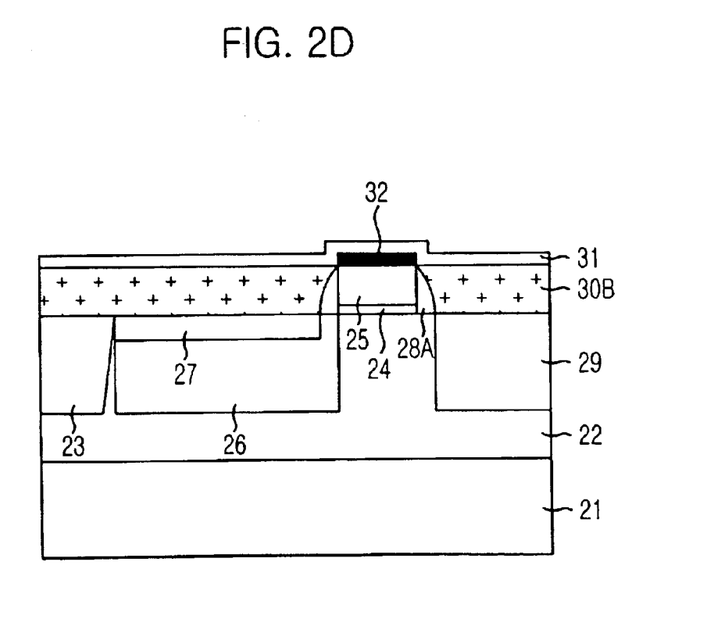

With reference to FIG. 2D, a salicide layer 32 is formed on top of the gate electrode 25 of which upper surface and upper corners are exposed. At this time, the salicide layer 32 is formed in accordance with a known method and materials.

For instance, a metal layer 31 constructed with one material selected from a group of Ti, Co, Mo, Ni-alloy is deposited on an entire structure including the salicide barrier layer 30B through the use of a sputtering technique. Then, the salicide layer 32 is formed on top of the gate electrode 25 by inducing a salicide reaction between the metal layer 31 and the gate electrode 25.

The salicide layer 32 is constructed with Ti-silicide, Co-silicide, Mo-silicide, Ni-silicide or Ni alloy-silicide.

Figure 2E:
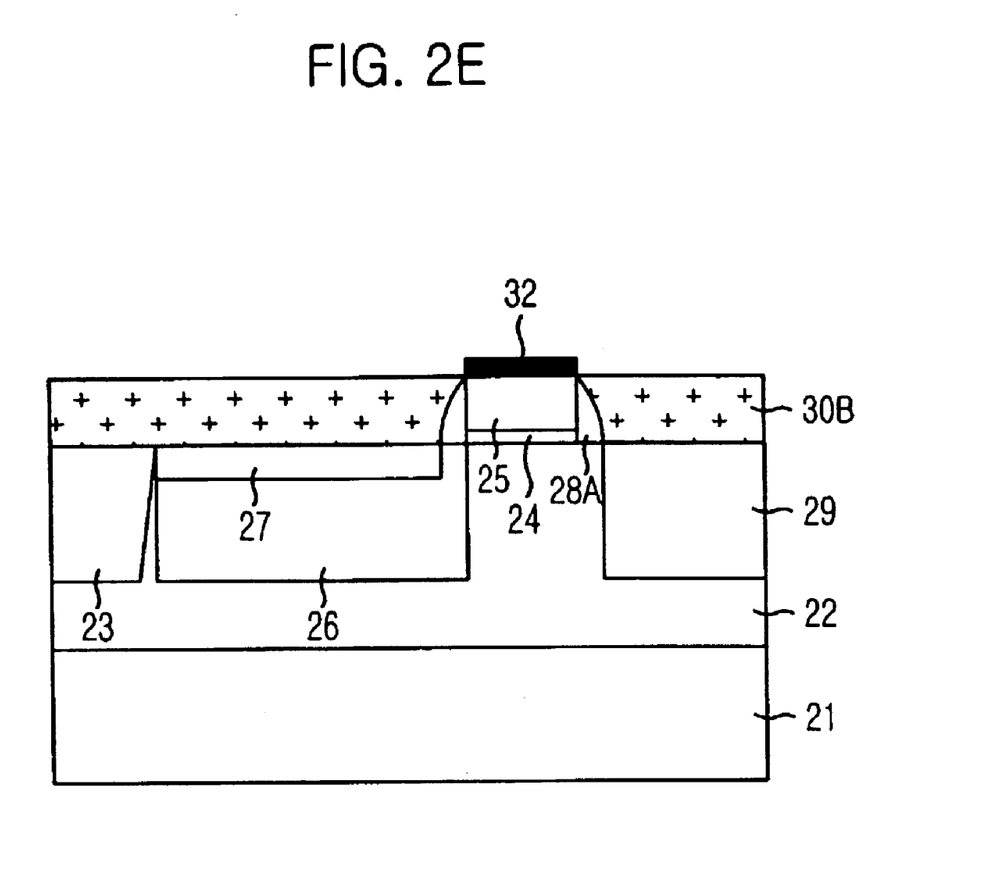

With reference to FIG. 2E, the metal layer 31 unreacted is removed. For instance, the metal layer 31 unreacted with silicide is removed by using a solution mixed with $NH_4OH$, $H_2O_2$ and $H_2O$ in a ratio of about 1 to 4 to 20 or HCl, $H_2O_2$ and $H_2O$ in a ratio of about 1 to 1 to 5.

In accordance with the first preferred embodiment of the present invention as described above, since the salicide barrier layer 30B covers an upper portion of the PD, it is possible to form the salicide layer 32 selectively on the gate electrode 25, which is a polysilicon layer.

FIGS. 3A to 3F are cross-sectional views illustrating an image sensor in accordance with a second preferred embodiment of the present invention.

Figure 3A:
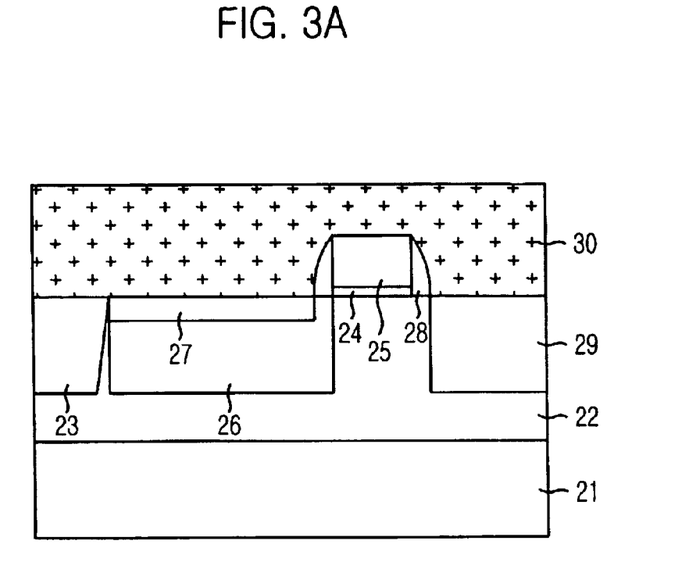
FIGS. 3A to 3F are cross-sectional views illustrating a method for fabricating an image sensor in accordance with a second preferred embodiment of the present invention.

Referring to FIG. 3A, a p-type epi-layer 22 doped with a low concentration of p-type impurities is grown on a p-type substrate 21 doped with a high concentration of p-type impurities. Herein, the reason for growing the p-type epi layer 22 is because a depth of a depletion layer of a photodiode can be increased due to the existence of the p-type epi layer 22, and thus, it is possible to obtain an excellent photosensitivity. Another reason for growing the p-type epi layer 22 is because the existing p-type substrate 21 doped with a high concentration of the p-type impurities recombines optical charges, which can be generated at a deeper side of the p-type substrate 21 where the depletion layer of the photodiode cannot be reached, as to prevent the crosstalk phenomenon which occurs between unit pixels due to irregular movements of the optical charges.

Next, a field insulating layer 23 for isolating the unit pixels is formed on a predetermined portion of the p-type epi layer 22 through the use of a local oxidation of silicon (LOCOS) technique.

On the p-type epi layer 22, a gate oxide layer 24 and a gate electrode 25 are stacked. At this time, the gate electrode 25 is a polysilicon layer and a gate electrode of a transfer transistor closely located to a photodiode (hereinafter referred as to PD).

An $n^-$ area 26 is formed within the p-type epi layer 22 at one side of the gate electrode 25 through an ion implantation technique using the gate electrode 25 and an additional photosensitive pattern (not shown) as a mask. The $n^-$ area 26 will be used for forming the PD in a subsequent process. Then, a shallow p⁰ area 27 is formed within the n⁻ area 26 of the p-type epi layer 22 through an blanket ion implantation technique.

Thereafter, an insulating spacer 28 on both lateral sides of the gate electrode 25 is formed. At this time, the insulating spacer 28 is formed through an etch-back process proceeded after depositing an oxide or nitride layer on the p-type epi layer 22 including the gate electrode 25.

Subsequently, a floating diffusion area 29 aligned to one edge of the insulating spacer of the gate electrode 25 in an opposite direction to the n⁻ area 26 is formed by employing the ion implantation technique using the gate electrode 25 and the insulating spacer 28 as an ion implantation mask.

Formations of the PD, the gate electrode of the transfer transistor and the floating diffusion area are completed in accordance with the above-described processes.

Next, an oxide layer 30 is deposited on the p-type epi layer 22 of the gate electrode 25. At this time, the oxide layer 30 is formed in such a form to cover the gate electrode 25 completely.

Figure 3B:
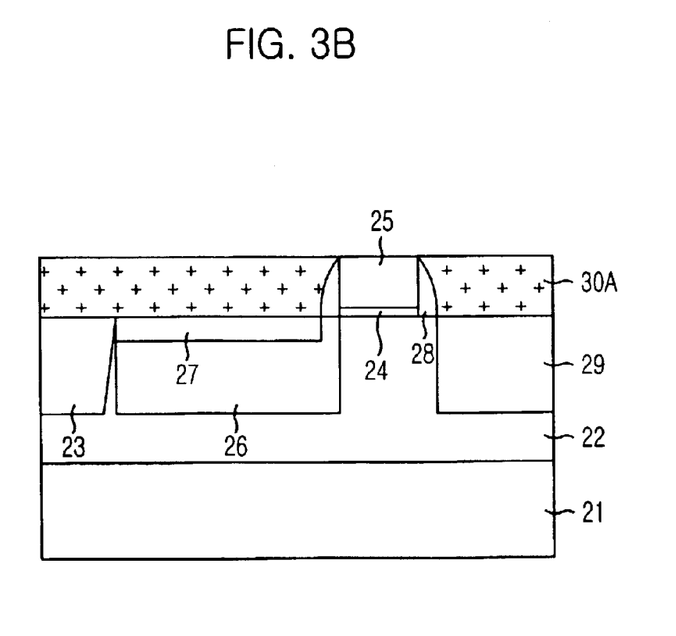

With reference to FIG. 3B, the oxide layer 30 is proceeded with a CMP process until exposing an upper surface of the gate electrode 25. At this time, after the CMP process, a polished oxide layer 30A remains on top of the photodiode and the floating diffusion area 29.

Figure 3C:
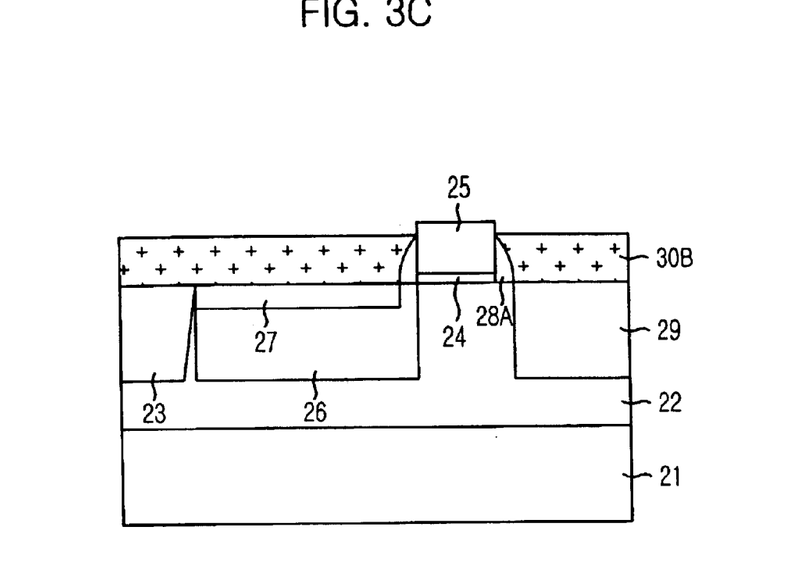

Referring to FIG. 3C, a salicide barrier layer 30B that exposes an upper surface and upper corners of the gate electrode 25 is formed by performing an over CMP process to obtain a subsequent salicide process margin. At this time, the salicide barrier layer 30B is formed by applying the over CMP process to the polishing oxide layer 30A, and still covers top portions of the PD and the floating diffusion area 29.

Due to the over CMP process, the insulating spacer 28 at both lateral sides of the gate electrode 25 is also partially polished. Hence, an insulating spacer pattern 28A is remained with a lowered height.

As seen from the above, the over CMP process is performed to obtain a process margin of the CMP process and a higher process margin when forming a subsequent salicide layer.

Figure 3D:
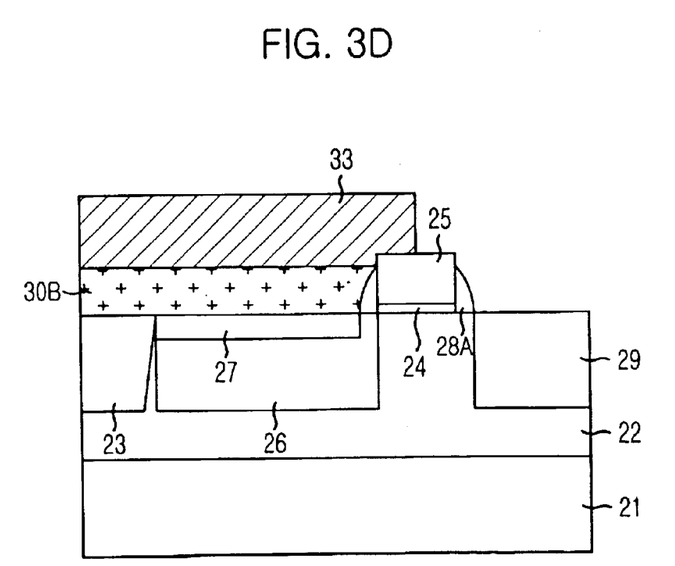

With reference to FIG. 3D, on the above established entire structure including the gate electrode 25 of which upper surface and upper corners are exposed, a photosensitive film is coated and then patterned through a photo-exposure process and a developing process so as to form a salicide mask 33. At this time, the salicide mask 33 is formed in such a form to cover a partial portion of the gate electrode 25 and the salicide barrier layer 30B deposited on an upper portion of the PD.

Next, the salicide barrier layer 30B formed on the floating diffusion area 29 is removed by using the salicide mask 33 as an etch mask.

Figure 3E:
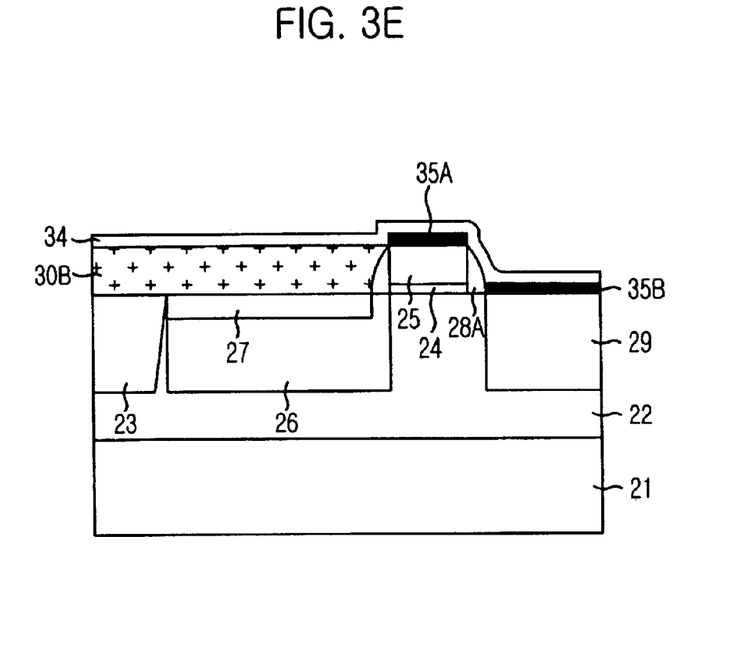

Referring to FIG. 3E, the salicide mask 33 is removed, and then, a first and a second salicide layers 35A and 35B are formed on the upper surfaces of the gate electrode 25 and the floating diffusion area 29. At this time, the first and the second salicide layer 35A and 35B are formed in accordance with a known method and materials. As known, on an upper surface of the insulating spacer 28A, there is no salicide layer formed.

For instance, a metal layer 34 constructed with one material selected from a group of Ti, Co, Ni, Mo, Ni-alloy is deposited on an entire structure including the salicide barrier layer 30B through the use of a sputtering technique. Then, the first salicide layer 35A is formed on top of the gate electrode 25 by inducing a salicide reaction among the metal layer 34, the gate electrode 25 and the floating diffusion area 29. Eventually, the first and the second salicide layers 35A and 35B are constructed with Ti-silicide, Co-silicide, Mo-silicide, Ni-silicide or Ni alloy-silicide.

Figure 3F:
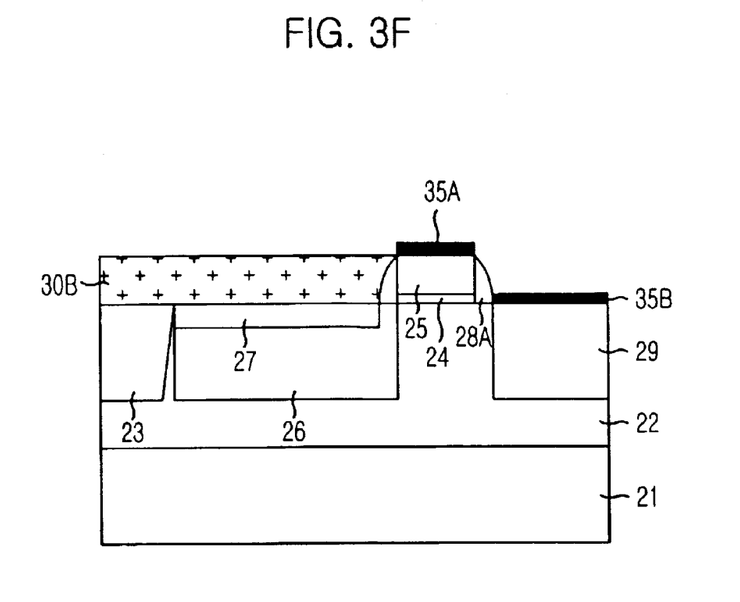

With reference to FIG. 3F, the metal layer 34 unreacted is removed. For instance, the metal layer 34 unreacted with silicide is removed by using a solution mixed with $NH_4OH$, $H_2O_2$ and $H_2O$ in a ratio of about 1 to 4 to 20 or $HCl$, $H_2O_2$ and $H_2O$ in a ratio of about 1 to 1 to 5.

In accordance with the second preferred embodiment of the present invention as described above, since the salicide barrier layer 30B covers the upper portion of the PD but opens the upper portions of the floating diffusion area 29 and the gate electrode 25, it is possible to form the first and the second salicide layers 35A and 35B selectively on the gate electrode 25 and the floating diffusion area 29.

Meanwhile, in the second preferred embodiment of the present invention, when the insulating spacer 28A is used as an oxide layer, the insulating spacer 28A can be also removed during the removal of the salicide barrier layer 30B. Therefore, a nitride layer is used for the insulating spacer 28A.

By following the preferred embodiment of the present invention, it is possible to obtain a sufficient process margin in a selective salicide process, thereby further obtaining stably characteristics of the unit pixel of the image sensor.

While the present invention has been described with respect to certain preferred embodiments, it will be apparent to those skilled in the art that various changes and modifications may be made without departing from the scope of the invention as defined in the following claims.

What is claimed is:

1. A method for fabricating an image sensor, comprising the steps of:

forming a gate electrode on a substrate;

forming an insulating spacer at lateral sides of the gate electrode;

forming a photodiode in the substrate exposed at an one edge of the gate electrode;

forming a floating diffusion area in the substrate exposed at the other edge of the gate electrode;

forming a salicide barrier layer on the photodiode, by applying an over chemical and mechanical polishing process to an oxide layer, wherein the salicide barrier layer exposes an upper surface and corners of the gate electrode; and forming a salicide layer on the exposed upper surface and the upper corners of the gate.

2. The method as recited in claim 1, wherein the step of forming the salicide barrier layer includes the steps of:

depositing an insulating layer on the substrate including the gate electrode, the photodiode and the floating diffusion area;

performing a chemical and mechanical polishing process to the insulating layer until exposing the upper surface of the gate electrode; and performing an over chemical and mechanical polishing process to the insulating layer until exposing the upper corners of the gate electrode.

3. The method as recited in claim 2, the insulating layer is formed with an oxide layer.

4. A method for forming an image sensor, comprising the steps of:

forming a gate electrode on a substrate;

forming an insulating spacer at lateral sides of the gate electrode;

forming a photodiode in the substrate exposed at one edge of the gate electrode;

forming a floating diffusion area in the substrate exposed at the other edge of the gate electrode;

forming a salicide barrier layer on the photodiode and the floating diffusion area, wherein the salicide barrier layer exposes an upper surface and upper corners of the gate electrode;

removing the salicide barrier layer on the floating diffusion area; and forming a plurality of salicide layers simultaneously formed on the upper surface and upper corners of the gate electrode and the upper surface of the floating diffusion area, wherein the step of removing the salicide barrier layer on top of the floating diffusion area includes the steps of:

forming a mask that opens the floating diffusion area on the salicide barrier layer;

etching the salicide barrier layer on the floating diffusion area exposed by the salicide mask; and removing the mask.

5. The method as recited in claim 4, wherein the forming the salicide barrier layer includes the steps of:

depositing an insulating layer on the substrate including the gate electrode, the photodiode and the floating diffusion area;

performing a chemical and mechanical polishing process to the insulating layer until exposing a surface of the gate electrode; and performing an over chemical and mechanical polishing process to the insulating layer until exposing the upper corners of the gate electrode.

6. The method as recited in claim 5, wherein the insulating layer is an oxide layer.

7. The method as recited in claim 4, wherein the salicide barrier layer is formed with an oxide layer.

8. The method as recited in claim 7, wherein the insulating spacer is formed with a nitride layer.

* * * * *